(12) United States Patent
Sano (10) Patent No.: US 7,167,497 B2
(45) Date of Patent: *Jan. 23, 2007

(54) NITRIDE SEMICONDUCTOR LASER DEVICE

(75) Inventor: Masahiko Sano, Tokushima (JP)

(73) Assignee: Nichia Corporation, Tokushima (JP)

( * ) Notice: Subject to any disclaimer, the term of this patent is extended or adjusted under 35 U.S.C. 154(b) by 263 days.

This patent is subject to a terminal disclaimer.

(21) Appl. No.: 10/866,723

(22) Filed: Jun. 15, 2004

(65) Prior Publication Data

US 2004/0233956 A1    Nov. 25, 2004

Related U.S. Application Data

(62) Division of application No. 10/203,903, filed on Aug. 15, 2002, now Pat. No. 6,838,701.

(51) Int. Cl.
    *H01S 5/00* (2006.01)
(52) U.S. Cl. .................. 372/46.01; 372/45.01
(58) Field of Classification Search ............. 372/45.01, 372/46.01, 43.01
    See application file for complete search history.

(56) References Cited

U.S. PATENT DOCUMENTS

| | | | |
|---|---|---|---|
| 5,804,839 A * | 9/1998 | Hanaoka et al. ............. | 257/103 |
| 6,522,676 B1 * | 2/2003 | Goto et al. ............... | 372/43.01 |
| 6,580,736 B1 * | 6/2003 | Yoshie et al. ............ | 372/45.01 |
| 6,711,191 B1 | 3/2004 | Kozaki et al. | |

FOREIGN PATENT DOCUMENTS

| | | | |
|---|---|---|---|
| EP | 1 030 377 A2 | * | 8/2000 |
| JP | 61-17146 | * | 5/1986 |
| JP | 63-124461 | * | 5/1988 |
| JP | 64-9382 | * | 1/1989 |
| JP | 8-279643 | * | 10/1996 |
| JP | 9-116111 | * | 5/1997 |
| JP | 10-27939 | * | 1/1998 |
| JP | 11-126947 | * | 5/1999 |
| JP | 11-150298 | | 6/1999 |
| JP | 11-220168 | * | 8/1999 |
| JP | 3031415 | * | 4/2000 |
| JP | 2000-252230 | * | 9/2000 |
| JP | 2000-286457 | * | 10/2000 |
| JP | 2000-315838 | | 11/2000 |
| WO | WO 00/52796 | | 9/2000 |
| WO | WO 0052796 | * | 9/2000 |

* cited by examiner

*Primary Examiner*—Minsun Oh Harvey
*Assistant Examiner*—Tuan N. Nguyen
(74) *Attorney, Agent, or Firm*—Morrison & Foerster LLP (57) ABSTRACT

A nitride semiconductor laser device of high reliability such that the width of contact between a p-side ohmic electrode and a p-type contact layer is precisely controlled. The device comprises a substrate, an n-type nitride semiconductor layer, an active layer, and a p-type nitride semiconductor layer. All the layers are formed in order on the substrate. A ridge part including the uppermost layer of the p-type nitride semiconductor layer of the p-type nitride semiconductor layer i.e., a p-type contact layer is formed in the p-type nitride semiconductor layer. A p-side ohmic electrode is formed on the p-type contact layer of the top of the ridge part. A first insulating film having an opening over the top of the ridge part covers the side of the ridge part and the portion near the side of the ridge part. The p-side ohmic electrode is in contact with the p-type contact layer through the opening. A second insulating film is formed on the first insulating film.

20 Claims, 3 Drawing Sheets

NITRIDE SEMICONDUCTOR LASER DEVICE

RELATED APPLICATIONS

This divisional application claims priority from parent application Ser. No. 10/203,903, filed Aug. 15, 2002, now U.S. Pat. No. 6,838,701 the entire disclosure of which is incorporated herein by reference.

TECHNICAL FIELD

The present invention relates to a laser device made of a nitride semiconductor ($Al_b In_c Ga_{1-b-c} N$, $0 \leq b$, $0 \leq c$, $b+c<1$).

BACKGROUND ART

Recently, nitride semiconductor laser devices capable of oscillating in blue wavelength region have been receiving much attention. Also there have recently been demands for a nitride semiconductor laser device that has a high output power. To meet these demands, a laser having ridge structure formed by partially etching a p-type contact layer and a part of a p-type cladding layer has been studied so as to achieve single transverse oscillation mode having good FFP (far field pattern) However, the ridge has a very small width, from 1 μm to 2 μm, and it is difficult to form an ohmic electrode having the same width as that of this ridge. To circumvent this difficulty, a p-type ohmic electrode that contacts with a nitride semiconductor only on the top surface of the ridge has been formed, by covering the entire nitride semiconductor except for the end face with an insulation film with only an n-electrode forming surface being left exposed, then forming the electrode that has a roughly determined width on the ridge. Then a pad electrode of 2-layer structure is formed on the p-type ohmic electrode by forming an Au film on an Au or Ni film.

With the nitride semiconductor laser device of the prior art, however, since the insulation film that covers the entire nitride semiconductor except for the end face needs to have a thickness not less than a certain value in order to protect the device, there has been such a problem that an aperture cannot be precisely formed on the top surface of the ridge, and therefore it is difficult to precisely control the width of contact between the p-type ohmic electrode and the p-type contact layer. Thus it has been difficult to manufacture a laser device with minimum variations in the device characteristics.

Also there has been such a problem that heat generated when the laser device is powered causes Au atoms of the pad electrode to gradually diffuse into a layer underneath, resulting in deterioration of the device characteristics. Particularly when mounting a laser device face-down, conspicuous deterioration of the device characteristics occurs since the diffusion of Au is accelerated by heating to a temperature of about 350° C. for the purpose of face-down mount.

DISCLOSURE OF THE INVENTION

An object of the present invention is to provide a nitride semiconductor laser device that has high reliability with less deterioration of the device characteristics, where the width of contact portion between a p-type ohmic electrode and a p-type contact layer can be precisely controlled.

In order to achieve the object described above, the nitride semiconductor laser device of the present invention comprises an n-type nitride semiconductor layer, an active layer and a p-type nitride semiconductor layer, that are formed successively on a substrate, with a ridge that includes at least a p-type contact layer in the top layer being formed in the p-type nitride semiconductor layer, and a p-type ohmic electrode that makes ohmic contact with the p-type contact layer formed on the ridge being formed substantially parallel to the direction of resonance, wherein a first insulation film that has an aperture formed at a position over the ridge is formed so as to cover at least the side face a proximate region outside the side face of the ridge, the p-type ohmic electrode is formed so as to make contact with the p-type contact layer through the aperture, and a second insulation film is formed on the first insulation film.

The constitution described above makes it possible to precisely control the width of contact between the p-type ohmic electrode and the p-type contact layer by forming the first insulation film precisely, and effectively protect the device by means of the second insulation film formed on the first insulation film, thereby achieving the nitride semiconductor laser device that has stable characteristics and high reliability.

In the nitride semiconductor laser device of the present invention, the second insulation film may be formed in continuation with a resonating end face so as to form a laser reflection plane on the resonating end face.

This constitution enables it to form the second insulation film and the laser reflection plane in a single process.

In the nitride semiconductor laser device of the present invention, the first insulation film and the second insulation film are preferably formed from oxide compound.

In the nitride semiconductor laser device of the present invention, the first insulation film is preferably formed from $ZrO_2$.

In the nitride semiconductor laser device of the present invention, the second insulation film is preferably formed from $TiO_2$ or $SiO_2$. Use of these materials enables the second insulation film to be formed in continuation with the resonating end face so as to form the laser reflection plane on the resonating end face, so that the second insulation film and the laser reflection plane can be formed in a single process.

When the second insulation film is formed in continuation with the resonating end face so as to form the laser reflection plane on the resonating end face, it is more preferable that the second insulation film is a multi-layered film made by forming $TiO_2$ layer and $SiO_2$ layer one on another.

In the nitride semiconductor laser device of the present invention, the p-type ohmic electrode is preferably made of an alloy by forming a layer of at least one kind selected from among a group consisting of Ni, Co, Fe, Ti and Cu and an Au layer one on another, and then annealing the layers.

In the nitride semiconductor laser device of the present invention, such a process may be employed as the second insulation film is formed so as to have an aperture located over the p-type ohmic electrode and the p-type pad electrode is formed so as to make contact with the p-type ohmic electrode through the aperture.

In the nitride semiconductor laser device of the present invention, it is preferable to form the p-type pad electrode so as to include a bonding layer that makes contact with the p-type ohmic electrode, a barrier layer and an Au layer that are formed in this order, while the bonding layer is made of a material that bonds better with the second insulation film and with the p-type ohmic electrode than the Au layer does, and the barrier layer is made of a material that is less likely to diffuse than the Au layer.

Such a constitution makes it possible to increase the bonding strength of the p-type ohmic electrode and the p-type pad electrode, and prevent Au located at the top of the pad electrode from diffusing into the other layers due to the heat generated by the current supplied to the device.

In the nitride semiconductor laser device of the present invention, it is preferable to form the bonding layer of the p-type pad electrode so as to include at least one material selected from among a group consisting of Ni, Cu, Ru, $RuO_2$, Ti W, Zr, Rh and RhO, in order to further increase the bonding strength of the p-type ohmic electrode and the p-type pad electrode.

In the nitride semiconductor laser device of the present invention, it is preferable to form the barrier layer of the p-type pad electrode so as to include at least one material selected from among a group consisting of Ti, Pt, W, Ta, Mo, nitride thereof and RhO, in order to effectively prevent Au from diffusing-into the other layers.

In the nitride semiconductor laser device of the present invention, in case the n-type nitride semiconductor layer includes the n-type contact layer that is partially exposed and the n-type pad electrode is formed on the exposed n-type contact layer via the n-type ohmic electrode, the n-type pad electrode is preferably made of the same material as the p-type pad electrode.

This constitution enables the n-type pad electrode and the p-type pad electrode to be formed in the same process.

In the nitride semiconductor laser device of the present invention, such a constitution may be employed as the p-type ohmic electrode is made of an alloy by forming a layer of at least one kind selected from among a group consisting of Ni, Co, Fe, Ti and Cu and an Au layer one on another, and then annealing the layers, wherein the second insulation film is formed so as to have an aperture at a position located over the p-type ohmic electrode and the p-type pad electrode is formed so as to make contact with the p-type ohmic electrode through the aperture.

In the nitride semiconductor laser device of the present invention, the p-type pad electrode may also be constituted from the bonding layer formed from Rh or RhO in contact with the p-type ohmic electrode, and the Au layer formed on the bonding layer.

This constitution results in improved heat resistance of the p-type ohmic electrode and the p-type pad electrode.

In this case, the p-type pad electrode may also be constituted from a bonding layer that is formed from Rh or Rho and makes contact with the p-type ohmic electrode, a barrier layer formed on the bonding layer from a material including at least one material selected from among a group of Ti, Pt, W, Ta, Mo and nitride thereof, and an Au layer formed on the barrier layer.

In order to improve the heat resistance of the p-type ohmic electrode and the p-type pad electrode further, such a constitution is preferable as an RhO layer is included in the top layer of the p-type ohmic electrode and the bonding layer is made of Rho.

The nitride semiconductor device of the present invention comprises a p-type nitride semiconductor layer, a p-type ohmic electrode formed on the p-type nitride semiconductor layer, and a p-type pad electrode formed on the p-type ohmic electrode, wherein the p-type ohmic electrode is made of an alloy by forming a layer of at least one kind selected from among a group consisting of Ni, Co, Fe, Ti and Cu and an Au layer one on another, and then annealing the layers, while the p-type pad electrode is constituted from a bonding layer formed from Rh or RhO in contact with the p-type ohmic electrode, a barrier layer formed on the bonding layer from at least one material selected from among a group of Ti, Pt, W, Ta, Mo and nitride thereof, and an Au layer formed on the barrier layer.

In the nitride semiconductor device of the present invention having the constitution described above, good ohmic contact can be established between the p-type nitride semiconductor layer and the p-type nitride semiconductor layer, and the heat resistance of the p-type ohmic electrode and the p-type pad electrode can be improved, thereby achieving the nitride semiconductor device having a long service life.

In the nitride semiconductor device of the present invention, in order to improve the heat resistance of the p-type ohmic electrode and the p-type pad electrode further, such a constitution is preferable as an RhO layer is included in the top layer of the p-type ohmic electrode and the bonding layer is made of RhO.

A method for forming the electrodes of the nitride semiconductor device is a process of forming the electrodes on the p-type nitride semiconductor layer, and comprises a step of forming the p-type ohmic electrode by forming a first layer made of at least one kind selected from among a group consisting of Ni, Co, Fe, Ti and Cu, an Au layer and an RhO layer successively on the p-type nitride semiconductor layer, a step of annealing the p-type ohmic electrode, a step of forming an RhO layer on the p-type ohmic electrode that has been annealed and a step of forming the p-type pad electrode on the p-type ohmic electrode including the formation of the Au layer.

In the nitride semiconductor device manufactured by the method of the present invention described above, good ohmic contact can be established between the p-type nitride semiconductor layer and the p-type nitride semiconductor layer, and the heat resistance of the p-type ohmic electrode and the p-type pad electrode can be improved, thereby achieving the nitride semiconductor device that has a long service life.

BEST MODE FOR CARRYING OUT THE INVENTION

Figure 1:
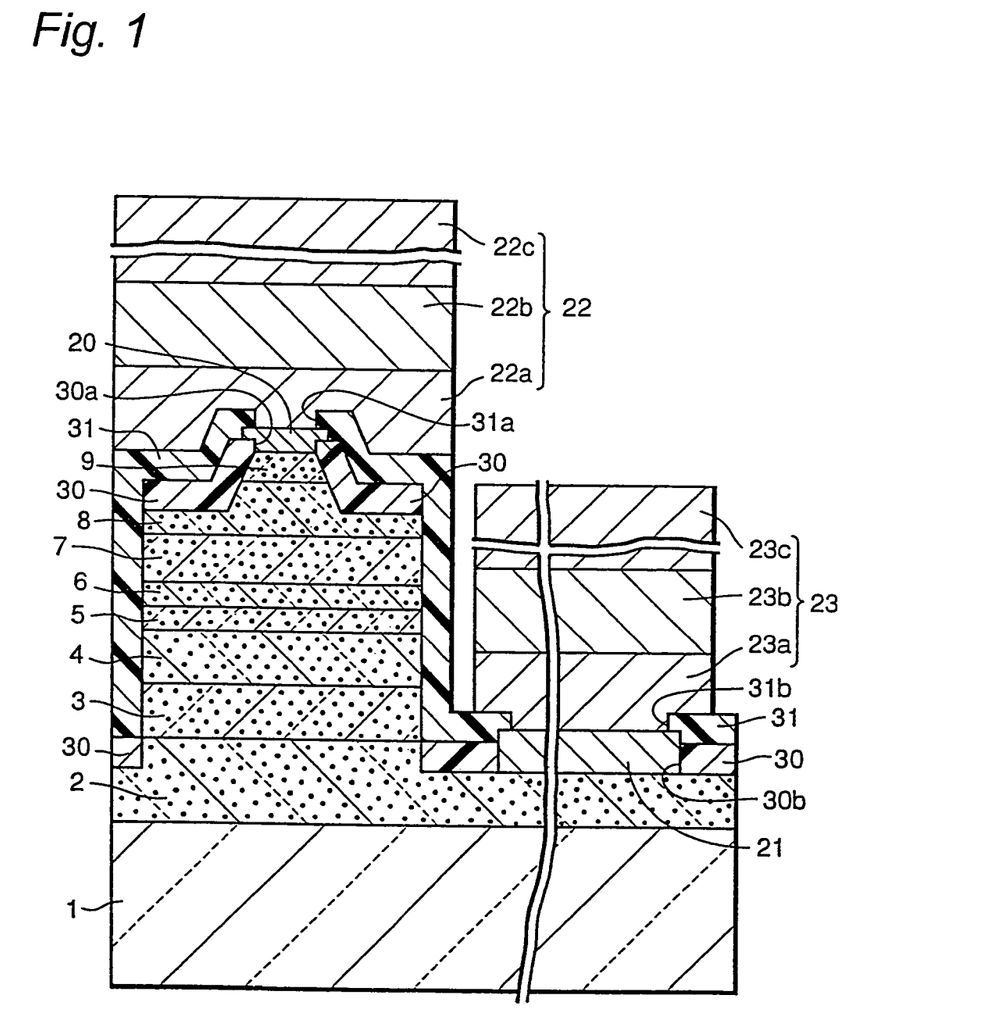
FIG. 1 is a schematic sectional view showing the constitution of the nitride semiconductor laser device according to an embodiment of the present invention.

Now the semiconductor laser diode according to an embodiment of the present invention will be described below with reference to the accompanying drawings. FIG. 1 is a schematic sectional view showing the constitution of a semiconductor laser diode according to this embodiment, showing a cross section perpendicular to the direction of laser oscillation.

The semiconductor laser diode of this embodiment is constituted from a plurality of semiconductor layers comprising a buffer layer (not shown), an n-type contact layer 2, an n-type cladding layer 3, an n-type optical guide layer 4, an active layer 5, a p-type cap layer 6, a p-type optical guide layer 7, a p-type cladding layer 8 and a p-type contact layer 9, formed successively as shown in FIG. 1, wherein a p-type ohmic electrode 20 is formed, so as to make contact with the p-type contact layer 9 through an aperture 30*a* of a first insulation film 30, on the p-type contact layer 9 having a ridge shape that is long enough in the direction of resonance, and an n-type ohmic electrode 21 is formed so as to make contact with the n-type contact layer 2 through an aperture 30b of the first insulation film 30, on the n-type contact layer 2 that has been exposed by etching.

The semiconductor laser diode of this embodiment is further provided with a second insulation film 31 that has apertures 31a, 31b at positions located over the p-type ohmic electrode 20 and the n-type ohmic electrode 21, respectively, while a p-type pad electrode 22 and an n-type pad electrode 23 are formed in electrical continuity with the p-type ohmic electrode 20 and the n-type ohmic electrode 21, respectively, via the apertures 31a, 31b.

In the semiconductor laser diode of this embodiment, the first insulation film 30 is formed mainly for the purpose of putting the p-type ohmic electrode 20 in satisfactory contact with the top surface of the p-type contact layer 9 (to ensure the accuracy in the shape of the area that makes ohmic contact), and is required to have enough heat resistance since annealing is required after forming the p-type ohmic electrode 20.

Since the first insulation film 30 is formed on both sides of the ridge, refractive index of the first insulation film 30 must be lower than that of the-p-type nitride semiconductor that constitutes the ridge (preferably as near to the dielectric constant of vacuum as possible).

Moreover, since the first insulation film 30 is formed near the ridge and it is necessary to form the aperture 30a with a high accuracy, the first insulation film 30 must be thin. For example, since the ridge is normally about 1.5 μm and 0.5 μm in width and height, respectively, the thickness of the first insulation film 30 is set to 0.5 μm or less.

In the semiconductor laser diode of this embodiment, the second insulation film 31 is formed mainly for the purpose of protecting the device, and is therefore made of a material that has effective protective function.

In this embodiment, the second insulation film 31 has the apertures 31a, 31b formed therein at positions above the p-type ohmic electrode 20 and the n-type ohmic electrode 21, respectively, while the p-type pad electrode and the n-type pad electrode are formed in electrical continuity with the p-type ohmic electrode 20 and the n-type ohmic electrode 21, respectively, via the apertures 31a, 31b.

However, since the aperture 31a used for the continuity between the p-type ohmic electrode 20 and the p-type pad electrode and the aperture 31b used for the continuity between the n-type ohmic electrode 21 and the n-type pad electrode are not required to have such a high dimensional accuracy as that of the aperture 30a of the first insulation film 30, the second insulation film 31 may be formed with a relatively large thickness.

Moreover, since the second insulation film 31 is not subjected to annealing after being formed as in the case of the first insulation film, the second insulation film 31 is not required to have as high heat resistance as the first insulation film 30.

Therefore, the second insulation film 31 may be made of a material that can effectively perform protective function, selected on the basis of appropriateness for the semiconductor laser diode.

In the semiconductor laser diode of this embodiment, the p-type pad electrode 22 comprises three layers of a bonding layer 22a that makes contact with the p-type ohmic electrode, a barrier layer 22b and an Au layer 22c.

In this embodiment, the bonding layer 22a of the p-type pad electrode 22 is made of such a material that bonds well with the second insulation film 31 that is formed on the ridge and with the p-type ohmic electrode 20, and is less likely to diffuse, for which preferable candidates are Ni, Cu, Ru, $RuO_2$, Ti, W, Zr, Rh and Rho. When the second insulation film is made of an oxide, in particular, the most preferable material is Ni that has high bonding characteristic with the second insulation film. In order to improve the heat resistance of the p-type pad electrode 22, the bonding layer 22a is preferably made of Rh or Rho.

The thickness of the bonding layer 22a is preferably in a range from 100 Å to 5000 Å, most from 500 Å to 2000 Å.

When the bonding layer 22a is made of Rh or RhO, the Rh layer or the RhO layer also functions as a barrier layer that prevents the Au layer 22c from diffusing. Therefore, when the bonding layer 22a is made of Rh or RhO, the barrier layer 22a can be omitted so as to constitute the p-type pad electrode 22 from two layers of the Rh layer or Rho layer and the Au layer 22c.

When the p-type pad electrode 22 is constituted from two layers of the Rh layer or RhO layer and the Au layer 22c, heat resistance of the p-type pad electrode 22 can be-made equivalent to or better than that of the p-type pad electrode constituted from the other combination described in this embodiment.

When the p-type pad electrode 22 is constituted from two layers of the combination described above, the thickness of the Rh layer or RhO layer is preferably in a range from 100 Å to 10000 Å, and the thickness of the Au layer 22c is preferably from 1000 Å to 30000 Å.

According to the present invention, the barrier layer 22b of the p-type pad electrode 22 is made of such a high-melting point metal as Au atoms in the top layer does not diffuse into the bonding layer or the lower layers or a nitride thereof, for example, Ti, Pt, W, Ta, Mo or TiN, and most preferably Ti. The thickness is preferably in a range from 100 Å to 5000 Å, most preferably from 500 Å to 2000 Å.

When the bonding layer 22a is made of Rh or RhO, as described above, the barrier layer 22a may be omitted.

The Au layer 22c located at the top of the p-type pad electrode 22 is the best material for wire bonding of the nitride semiconductor device. The thickness of the Au layer is preferably in a range from 1000 Å to 20000 Å, more preferably from 5000 Å to 10000 Å.

According to the present invention, the p-type ohmic electrode 20 is made of at least one kind selected from a group consisting of Ni, Co, Fe, Ti and Cu, and Au. Ni, Co, Fe, Ti and Cu are all metal elements that can turn into ions having valence of 2. After forming layers from one kind selected from a group consisting of Ni, Co, Fe, Ti and Cu, and Au one on another, the layers are annealed to form an alloy, so that good ohmic contact with the p-type nitride semiconductor layer is achieved. Annealing is carried out at a temperature at which the nitride semiconductor is not subjected to an adverse effect such as dissociation of In from InGaN that is grown before forming the ohmic electrode, preferably in a range from 400° C. to 700° C., more preferably from 500° C. to 650° C. Best ohmic characteristic of the p-type ohmic electrode 20 can be achieved by selecting Ni from the group of metals described above and using Ni and Au. Since the alloy, that is formed by annealing the layers of Ni and Au formed one on another, includes Ni, the best structure may be obtained when the bonding layer 22a of the p-type pad electrode 22 formed through partial contact with the p-type ohmic electrode is made from Ni, which leads to higher bonding strength between Ni atoms. The total thickness of the layers made of one of the group of metals described above or Ni and Au is preferably in a range from 150 Å to 5000 Å, most preferably 1500 Å.

When an RhO layer is formed as the bonding layer 22a, it is preferable to form the p-type pad electrode after forming the Rho layer on the Au layer of the p-type ohmic electrode 20 and then annealing the layers.

The heat resistance of the p-type pad electrode 22 can be improved further by making the p-type ohmic electrode 20 in Ni—Au—Rh structure and forming the p-type pad electrode 22 that includes the RhO layer as the bonding layer 22a.

Electrode characteristics of various combinations of the constitution of the p-type ohmic electrode 20 and the constitution of the p-type pad electrode described above are shown in Table 1 in comparison with regard to heat resistance.

The heat resistance of the p-type pad electrode was evaluated in terms of the temperature at which the ohmic characteristic changed.

Change in the ohmic characteristic was observed by forming a p-type ohmic electrode and a p-type pad electrode at a predetermined distance from each other on a p-type gallium nitride compound semiconductor layer, and measuring the resistance between the two electrodes.

TABLE 1

| No. | p-type ohmic electrode | p-type pad electrode | AuSn | Temperature at which ohmic characteristic changed |
|---|---|---|---|---|
| 1 | Ni-Au | Ni-Au | No | 325 |
| 2 | Ni-Au | Ni-Au | Present | 275 |
| 3 | Ni-Au | Ni-Ti-Au | No | 325 |
| 4 | Ni-Au | Ni-Ti-Au | Present | 325 |
| 5 | Ni-Au | Rh-Au | No | 325 |
| 6 | Ni-Au | Rh-Au | Present | 325 |
| 7 | Ni-Au | RhO-Au | No | 350 |
| 8 | Ni-Au | RhO-Au | Present | 350 |
| 9 | Ni-Au | RhO-Pt-Au | No | 350 |
| 10 | Ni-Au | RhO-Pt-Au | Present | 350 |
| 11 | Ni-Au-RhO | Ni-Ti-Au | No | 300 |
| 12 | Ni-Au-RhO | Ni-Ti-Au | Present | 300 |
| 13 | Ni-Au-RhO | RhO-Au | No | 375 |
| 14 | Ni-Au-RhO | RhO-Au | Present | 375 |
| 15 | Ni-Au-RhO | RhO-Pt-Au | No | 375 |
| 16 | Ni-Au-RhO | RhO-Pt-Au | Present | 375 |

The thickness was set as follows for the Ni, Au and RhO layers of the p-type pad electrode and the p-type ohmic electrode that were used in the test summarized in Table 1.

Ni layer thickness was set to 100 Å and Au layer thickness was set to 1300 Å for the p-type ohmic electrode of No. 1 through No. 10.

Ni layer thickness was set to 100 Å, Au layer thickness was set to 660 Å and RhO layer thickness was set to 1500 Å for the p-type ohmic electrode of No. 11 through No. 16.

The thickness of the layer corresponding to the bonding layer and the barrier layer was set to 1500 Å and Au layer was set to 6000 Å for the p-type pad electrode shown in Table 1.

Data of Nos. 1 and 2 in Table 1 are shown for comparison.

Presence of AuSn is shown by whether AuSn is soldered (Present) or not (No) on the p-type pad electrode, since heat resistance often deteriorates after soldering of AuSn.

As described above, forming the p-type pad electrode from RhO—Au or RhO—Pt—Au makes it possible to prevent alloying with the p-type ohmic electrode and prevent AuSn, that is usually used for the connection of the p-type pad electrode with other electrodes, from diffusing into the p-type ohmic electrode.

Therefore, forming the p-type pad electrode from RhO—Au or RhO—Pt—Au makes it possible to prevent service life from deteriorating due to the p-type ohmic electrode and the p-type pad electrode and achieve the nitride semiconductor laser diode of longer service life.

In order to study the relationship between the heat resistance and service life of the p-type ohmic electrode and the p-type pad electrode, a laser diode (LD1) having the p-type ohmic electrode and the p-type pad electrode shown as No. 7 in Table 1 and a laser diode (LD2) having the p-type ohmic electrode and the p-type pad electrode shown as No. 3 in Table 1 were made and tested to determine the service life under the conditions of continuous oscillation with 5 mW of output power at 50° C. In a test after connecting by wire bonding, the LD1 showed service life of 5934 hours in average of three samples and LD2 showed service life of 1805 hours in average of three samples.

In a test after connecting by flip chip bonding, the LD1 showed service life of 3346 hours in average of three samples.

The n-type pad electrode 23 comprises three layers of a bonding layer 23a, a barrier layer 23b and an Au layer 23c.

In this embodiment, the bonding layer 23a of the n-type pad electrode 23 is made of such a material that bonds well with the second insulation film 31, that is formed on a part of the n-type contact layer, and with the n-type ohmic electrode 21 and is less likely to diffuse. In case the second insulation film is made of an oxide, Ni that has good bonding characteristic with the second insulation film 31 is the most preferable material. Thickness is preferably in a range from 100 Å to 5000 Å, most preferably from 500 Å to 2000 Å.

In this embodiment, the barrier layer 23b of the n-type pad electrode 23 is made of such a high-melting point metal as Au atoms included in the top layer does not diffuse into the bonding layer or the lower layers or a nitride thereof, for example, Ti, Pt, W, Ta, Mo or TiN, and most preferably Ti. The thickness of the barrier layer 23b is preferably in a range from 100 Å to 5000 Å, and most preferably from 500 Å to 2000 Å.

The Au layer 23c located at the top of the n-type pad electrode 23 is the material most suitable for wire bonding of the nitride semiconductor laser device. The thickness of the Au layer is preferably in a range from 1000 Å to 20000 Å, and more preferably from 5000 Å to 10000 Å.

The constitution of the n-type pad electrode 23 may be the same as or different from the constitution of the p-type pad electrode 22. But it is preferable to make the n-type pad electrode 23 in the same constitution as that of the p-type pad electrode 22, since the laser device manufacturing process can be simplified thereby.

According to the present invention, the n-type ohmic electrode 21 may be made by forming Ti and Au layers one on another that are materials having high ohmic contact capability with the n-type nitride semiconductor and high bonding characteristic. In order to improve the ohmic characteristic further, the layers are preferably annealed so as to form an alloy. Annealing is carried out at a temperature at which the nitride semiconductor is not subjected to an adverse effect such as dissociation of In from InGaN that is made before forming the ohmic electrode, similarly to the case of forming the p-type ohmic electrode, preferably in a range from 400° C. to 700° C., more preferably 500° C. to 650° C. The total thickness of the Ti/Al layer for the n-type ohmic electrode is preferably in a range from 150 Å to 10000 Å, and most preferably 5000 Å. Other materials that have high ohmic contact capability and high bonding characteristic include alloys made by annealing layers of W/Al, Ti/Au, V/Al, V/Au or the like, and single elements such as Al, Ti and W.

According to the present invention, annealing of the p-type ohmic electrode and the n-type ohmic electrode is preferably carried out in oxygen atmosphere since good ohmic characteristic can be obtained by supplying oxygen.

The first insulation film that covers the nitride semiconductor such as the p-type nitride semiconductor layer where the ridge is formed in the present invention is made of an oxide, for which $ZrO_2$ or the like can be preferably used.

In this embodiment, the first insulation film 30 that covers the nitride semiconductor such as the p-type nitride semiconductor layer where the ridge is formed is preferably made of an oxide that can endure the annealing temperature. The second insulation film 31 is also preferably made of an oxide, such as $SiO_2$ or $TiO_2$. When the second insulation film 31 is made of an oxide, strong bonding can be achieved between the bonding layers of the p-type pad electrode and the n-type pad electrode. The second insulation film can also be made of the same material and in the same process as the reflector film formed on the resonating end face of the laser, in which case it is preferably formed in a multi-layered film of $SiO_2$ and $TiO_2$. Specifically, two pairs of $SiO_2$ film 700 Å thick and $TiO_2$ film 400 Å thick ($SiO_2/TiO_2$) may be formed one on another, so that the portion at the end face functions as a reflector film and the rest functions as a protective film.

According to the present invention, the pair of ($SiO_2/TiO_2$) may also be stacked more than two times, and the second insulation film 31 that can also function as the reflector film of the laser is not limited to the pair of ($SiO_2/TiO_2$), as a matter of course.

Now other constitutions according to this embodiment will be described below. It needs not to say that the present invention is not limited to the constitutions described below.

The substrate may be made of a different material such as sapphire, or may be a GaN substrate that is made by a known process. A buffer layer made of GaN is preferably formed on the substrate, which enables it to achieve good crystallinity of nitride semiconductor to be formed on the substrate later. The buffer layer is particularly effective when forming the nitride semiconductor on the substrate of a different material. The substrate of different material refers to a substrate made of a material other than the nitride semiconductor.

The nitride semiconductor of the present invention may be formed in any layer structure. The nitride semiconductor may be grown by a vapor phase growth process such as metal organic vapor phase epitaxy (MOVPE) or hydride vapor phase epitaxy (HDCVD).

The n-type contact layer is used to form the n-type electrode, so as to improve the ohmic characteristic by doping with an n-type impurity such as Si. After forming the p-type layer, the p-type layer is etched so as to expose a part of the n-type contact layer, and the n-type electrode is formed on the exposed n-type contact layer.

A crack prevention layer is formed on the n-type contact layer in order to reduce the occurrence of cracks in the substrate by making undoped constitution. The crack prevention layer may also be made of InGaN or the like so as to have a refractive index different from that of the n-type cladding layer, so that light emitted from the active layer is prevented from reflecting on the substrate of different material and returning into the nitride semiconductor layer. This layer may be omitted.

The n-type cladding layer maybe formed either in a single layer doped with an n-type impurity such as Si or in a super lattice structure consisting of an undoped layer and a layer doped with an n-type impurity formed one on another, so as to function as a layer that supplies electrons to the active layer as well as a layer that confines carrier and light in the active layer.

The n-type optical guide layer constitutes an optical waveguide together with the active layer, by compensating for the reduced thickness of the active layer of multiple quantum well structure or the like. Therefore, then-type optical guide layer is made in such a constitution that has a sufficient difference in refractive index from the n-type cladding layer and less difference in refractive index from the active layer that formed above. This layer may be doped with an n-type impurity or undoped, and may also be formed in a super lattice structure consisting of an undoped layer and a layer doped with an n-type impurity formed one on another.

The active layer is formed in single quantum well structure made of InGaN or multiple quantum well structure that includes at least a well layer made of InGaN and a barrier layer. When formed in multiple quantum well structure, either one or both of the well layer and the barrier layer may be doped with impurity. Preferably the barrier layer is doped with an impurity which decreases the threshold current. The well layer is formed with the thickness of 30 to 60 Å and the barrier layer is formed to the thickness of 90 to 150 Å.

An active layer having multiple quantum well structure may start with a barrier layer and end with a well layer, start with a barrier layer and end with a barrier layer, start with a well layer and end with a barrier layer, or start with a well layer and end with a well layer. Preferably, the active layer comprises two to five pairs of well layer and barrier layer stacked one on another starting with a barrier layer, more preferably three pairs of well layer and barrier layer stacked one on another, which results in decreased threshold value and longer service life.

The p-type cap layer provided on the active layer is capable of replenishing positive holes that tend to be less than electrons supplied from the n side to the active layer by heavily doping with p-type impurity such as Mg. Increasing the concentration of the p-type impurity higher than in the p-type optical guide layer and in the p-type cladding layer results in diffusion of the p-type impurity into the p-type layer formed on the p-type cap layer, and is preferable. Moreover, this layer has an effect of suppressing the dissociation of In of the active layer. When this function is intended as the main objective, the layer may be left undoped. The p-type cap layer may also be omitted.

The p-type optical guide layer that includes a p-type impurity such as Mg may be either intentionally doped with the p-type impurity or formed without doping, since the p-type impurity diffuses from the p-type cap layer when the p-type cap layer is doped with the p-type impurity. The p-type optical guide layer, that is provided for the purpose of forming the optical guide layer similarly to the n-type optical guide layer, and is made in such a constitution that has a sufficient difference in refractive index from the p-type cladding layer and less difference in refractive index from the active layer that formed underneath.

The p-type cladding layer serves as a positive hole supplying layer for the active layer, and can be formed either in a single layer doped with a p-type impurity such as Mg or in a super lattice structure consisting of an undoped layer and a layer doped with a p-type impurity formed one on another.

The p-type contact layer is provided for the purpose of forming the p-type electrode, and can have good ohmic contact with the p-type electrode when doped with a p-type impurity such as Mg relatively heavily.

In the semiconductor laser diode of this embodiment having the constitution described above, the first insulation film 30 is formed for the purpose of forming a portion of the p-type contact layer 9 that makes ohmic contact with the p-type ohmic electrode 20 with a high accuracy, and the second insulation film 31 is formed for the purpose of protecting the device. Since this allows it to select the best material and configuration (thickness, etc.) for the functions of the first insulation film 30 and the second insulation film 31, stable laser oscillation can be achieved, short circuiting due to insufficient insulation can be prevented and leakage current can be decreased, thus resulting in the semiconductor laser diode having high reliability.

In the semiconductor laser diode of this embodiment, each of the p-type pad electrode 22 and the n-type pad electrode 23 is constituted from three layers of a bonding layer that is made of a high-melting point metal or nitride thereof and bonds well with the p-type ohmic electrode or n-type ohmic electrode and the second insulation film 31, a barrier layer that prevents diffusion of Au from the layer formed thereon and an Au layer.

With this constitution, bonding performance with the ohmic electrode and the second insulation film 31 can be made higher, and diffusion of Au due to heat generated by the current supplied can be prevented, deterioration of the characteristics can be prevented and reliability can be improved.

Variations

Figure 2:
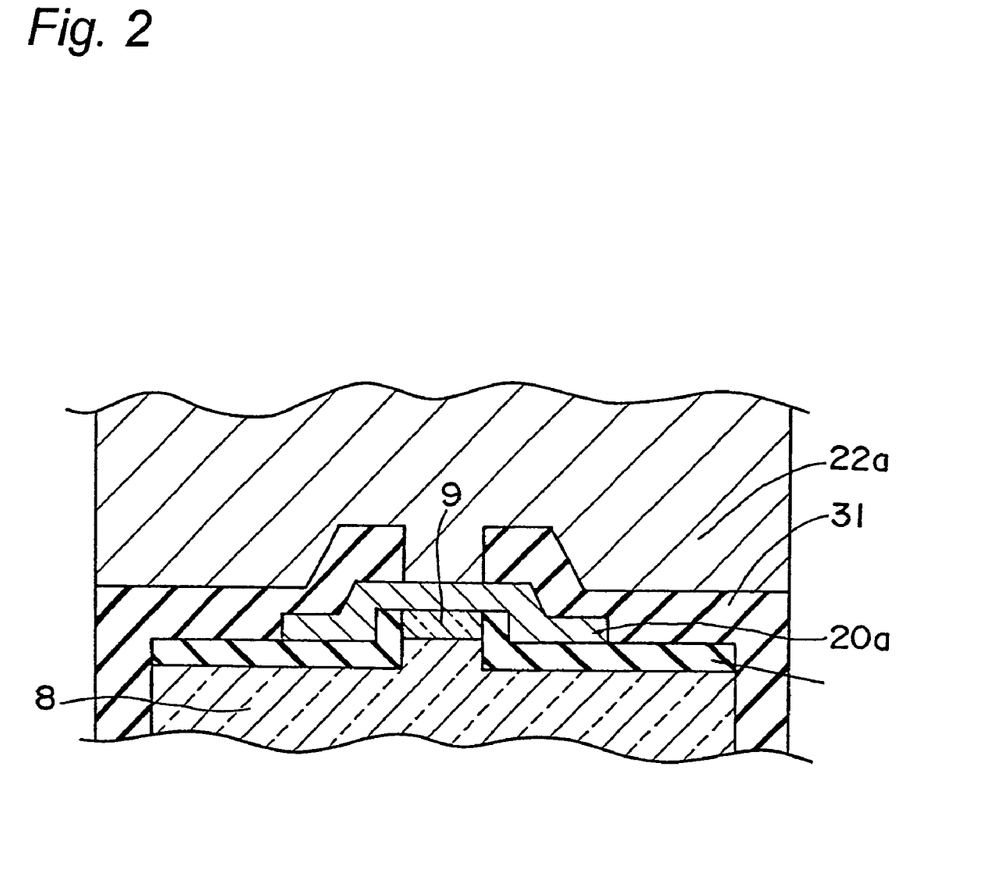
FIG. 2 is a partial sectional view showing the constitution of the nitride semiconductor laser device according to a variation of the present invention.
Figure 3:
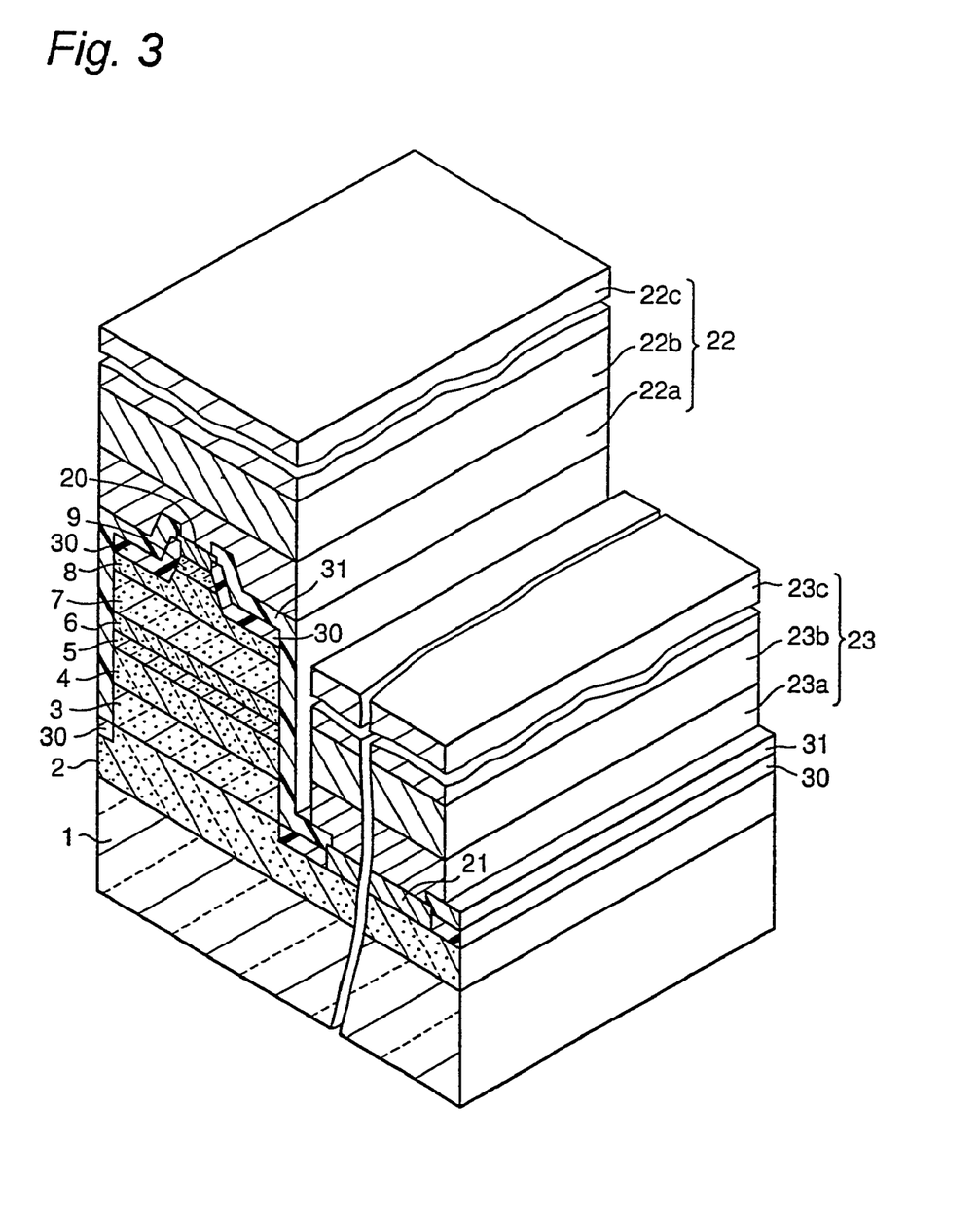
FIG. 3 is a perspective view of the nitride semiconductor laser device shown in FIG. 1.

In the nitride semiconductor laser device of the embodiment described above, the p-type ohmic electrode 20 is formed on the top surface of the ridge. But the present invention is not limited to this constitution, and the p-type ohmic electrode 20 may also be formed so as to cover the entire ridge and extends over the p-type cladding layer 8 on both sides of the ridge, as shown in FIG. 2.

Operations and effects similar to those of the embodiments can be achieved also with such a constitution.

EXAMPLES

Examples of the present invention will be described below, but the present invention is not limited thereto.

Example 1

(Buffer Layer)

A GaN substrate obtained by a known method on sapphire with the principal plane lying in the C plane having diameter of 2 inches is set in a MOVPE reaction vessel, and a first buffer layer made of GaN is formed to the thickness of 200 Å by using trimethyl gallium (TMG) and ammonia ($NH_3$). After growing the first buffer layer, a second buffer layer made of GaN is grown to the thickness of 0.5 μm while raising the temperature.

(n-type Contact Layer)

An n-type contact layer made of GaN doped with Si in concentration of $1\times10^{18}/cm^3$ is formed to the thickness of 4 μm by using ammonia and TMG, and silane gas used as an impurity gas.

(Crack Prevention Layer)

Then a crack prevention layer made of InGaN is formed to the thickness of 0.15 μm at a temperature of 800° C. by using TMG, TMI (trimethyl indium), and ammonia.

(n-type Cladding Layer)

After growing layer an undoped AlGaN layer to the thickness of 25 Å at a temperature of 1050° C. by using TMA (trimethyl aluminum), TMG and ammonia, supply of TMA is stopped and silane gas is supplied, and a layer made of n-type GaN doped with Si in concentration of $1\times10^{19}/cm^3$ is formed to the thickness of 25 Å. Super lattice structure is formed by stacking these layers, so as to form the n-type cladding layer having super lattice of the total thickness 1.2 μm.

(n-type Optical Guide Layer)

Then at a similar temperature, an n-type optical guide layer made of undoped GaN is formed to the thickness of 750 Å by using TMG and ammonia as the stock material gas.

(Active Layer)

Then by setting the temperature to 800° C., a barrier layer made of InGaN doped with Si in a concentration of $5\times10^{18}/cm^3$ to the thickness of 100 Å by using TMG and TMI and ammonia as the stock material gas and silane gas as the impurity gas. Then, with the temperature being lowered to 820° C., the supply of silane gas is stopped and a well layer made of undoped InGaN is formed to the thickness of 50 Å. The barrier layer and the well layer are further stacked two times followed by the last formation of barrier layer, thereby to form the active layer of multiple quantum well structure (MQW) having the total thickness of 550 Å.

(p-type Cap Layer)

Then a p-type cap layer made of p-type GaN doped with Mg in a concentration of $1\times10^{20}/cm^3$ is formed to a thickness of 100 Å by stopping the supply of TMI and supplying $Cp_2Mg$.

(p-type Optical Guide Layer)

Then with the supply of $Cp_2Mg$ being stopped, a p-type optical guide layer made of undoped GaN is formed to a thickness of 0.1 μm at a temperature of 1050° C. While the p-type optical guide layer is grown as an undoped layer, diffusion of Mg from the p-type cap layer increases the Mg concentration to $5\times10^{16}/cm^3$ and turns the layer to p-type.

(p-type Cladding Layer)

Then with the supply of $Cp_2Mg$ being stopped and TMA being supplied, a layer of undoped AlGaN is formed to a thickness of 25 Å at 1050° C. Then the supply of TMA is stopped and $Cp_2Mg$ is supplied, a layer of Mg-doped GaN is formed to a thickness of 25 Å with Mg concentration of $1\times10^{19}/cm^3$, thereby forming the p-type cladding layer constituted from super lattice structure of the total thickness of 0.6 μm.

(p-type Contact Layer)

Last, a p-type contact layer made of p-type GaN doped with Mg in a concentration of $1\times10^{20}/cm^3$ is formed to the thickness of 150 Å on the p-type cladding layer.

(Formation of Ridge)

After forming the nitride semiconductor layers as described above, the wafer is taken out of the reaction vessel, and an $SiO_2$ mask is formed on a part of the p-type nitride semiconductor layer so as to expose the n-type nitride semiconductor layer, and the surface of the n-type contact layer is exposed by the RIE (reactive ion etching) process.

Then a protective film of $SiO_2$ is formed in a stripe pattern of 1.5 μm in width on the p-type nitride semiconductor layer via a mask of a predetermined shape on the n-type nitride semiconductor layer that has been exposed. After forming the protective film, a waveguide (ridge) in a stripe pattern of 1.5 µm in width is formed by etching to near the interface between the p-type cladding layer and the p-type optical guide layer by RIE as shown in FIG. 1.

(First Insulation Film)

After forming the ridge, the first insulation film made of $ZrO_2$ is formed on the surface of the p-type nitride semiconductor layer while leaving the $SiO_2$ mask to remain thereon. The first insulation film may also be formed over the entire surface of the nitride semiconductor layer by masking the n-type ohmic electrode. After forming the first insulation film, the device is immersed in buffered hydrofluoric acid so as to dissolve and remove the $SiO_2$ from the p-type contact layer, and $ZrO_2$ formed on the p-type contact layer (or further on the n-type contact layer) is removed together with $SiO_2$ by lift-off process.

(Ohmic Electrode)

Then the p-type ohmic electrode made of Ni and Au in stripe configuration is formed in contact with the ridge surface provided on the p-type contact layer and the first insulation film.

Also the n-type ohmic electrode made of Ti and Al in stripe configuration is formed in contact with the surface of the n-type contact layer (and in contact with the first insulation film).

After forming these layers, both the p-type and n-type ohmic electrodes are turned into alloys by annealing in an atmosphere consisting of oxygen and nitrogen in concentrations of proportion 80:20 at 600° C., thereby to achieve good ohmic characteristic.

(Second Insulation Film)

Then the second insulation film made of $SiO_2$ is formed over the entire surface, and a resist is applied to the p-type ohmic electrode and the n-type ohmic electrode except for a part thereof, and the part of the p-type ohmic electrode and the n-type ohmic electrode is exposed by dry etching.

(Pad Electrode)

After forming the second insulation film, a bonding layer made of Ni is formed to the thickness of 1000 Å as the pad electrode in a single process so as to cover the second insulation film provided on the p-type nitride semiconductor layer and the p-type ohmic electrode on the p side, and cover a part of the second insulation film and the n-type ohmic electrode on the n side.

A barrier layer made of Ti is formed on the bonding layer to the thickness of 1000 Å, and then an Au layer is formed to the thickness of 8000 Å.

After forming the p-type pad electrode and the n-type pad electrode as described above, the nitride semiconductor is etched in a mesh pattern by RIE till the sapphire substrate is exposed, so as to separate the nitride semiconductor into chips. At this time, the laser output plane is etched at a position immediately before the laser output end face so that good FFP (far field pattern) of laser beam is obtained. After etching, the sapphire is scribed along the mesh pattern where the sapphire is exposed by etching, so as to make laser chips. Separation of the laser chips may also be done by cleaving the GaN along M plane of the nitride semiconductor (the plane that corresponds to a side surface when the nitride semiconductor is represented by a hexagonal prism).

In an oscillation test of the laser chip having electrodes wire-bonded thereon at the room temperature, continuous oscillation at wavelength of 405 nm with an output power of 30 mW was confirmed with threshold of 2.0 kA/cm² at room temperature and service life of 1000 hours or longer.

Example 2

A nitride semiconductor laser device was made in the same manner as in Example 1, except for forming the second insulation film from $TiO_2$.

In a test of this laser chip conducted in the same manner as in Example 1, continuous oscillation at wavelength of 405 nm with an output power of 30 mW was confirmed with threshold of 2.0 kA/cm² at room temperature and service life of 1000 hours or longer.

Example 3

A nitride semiconductor laser device was made in the same manner as in Example 1, except for forming the n-type pad electrode and the p-type pad electrode from Pt.

In a test of this laser chip, continuous oscillation at wavelength of 405 nm with an output power of 30 mW was confirmed with threshold of 2.2 kA/cm² at room temperature and service life of 1000 hours or longer, that are nearly the same as those of Example 1.

Example 4

A nitride semiconductor laser device was made in the same manner as in Example 1, except for forming the bonding layers of the n-type pad electrode and the p-type pad electrode from Ti and forming the barrier layer from Pt.

In a test of this laser chip, continuous oscillation at wavelength of 405 nm with an output power of 30 mW was confirmed with threshold of 2.2 kA/cm² at room temperature and service life of 1000 hours or longer, that are nearly the same as those of Example 1.

Example 5

A nitride semiconductor laser device was made in the same manner as in Example 1, except for forming the p-type pad electrode in the constitution of Ni/Ti/Au and the n-type pad electrode in the constitution of Ti/Pt/Au with bonding layer made of Ti and the barrier layer made of Pt.

Although the manufacturing process for this nitride semiconductor laser device is more complex than that of Example 1, continuous oscillation at wavelength of 405 nm with an output power of 30 mW was confirmed with threshold of 2.1 kA/cm² at room temperature and service life of 1000 hours or longer.

Example 6

The ohmic electrode was formed in the same manner as in Example 1 with the following exception.

(Ohmic Electrode)

The p-type ohmic electrode us formed in stripe configuration from Ni and Au in contact with the ridge surface provided on the p-type contact layer and the first insulation film.

Also the n-type ohmic electrode made of Ti and Al in stripe configuration is formed in contact with the surface of the n-type contact layer (and in contact with the first insulation film).

After forming these electrodes, annealing was applied at 600° C. in an atmosphere of 100% oxygen.

The nitride semiconductor laser device made in the same manner as in Example 1, except for the annealing 100% oxygen atmosphere showed continuous oscillation at wavelength of 405 nm with an output power of 30 mW was confirmed with threshold of 2.2 kA/cm² at room temperature and service life of 1000 hours or longer.

INDUSTRIAL APPLICABILITY

As described in detail above, the nitride semiconductor laser device of the present invention has such a novel structure as the two insulation films are provided that enables it to precisely control the width of contact between a p-type ohmic electrode and a p-type contact layer, and therefore the nitride semiconductor laser device that has stable characteristics can be provided.

In the nitride semiconductor laser device of the present invention, good ohmic contact with the nitride semiconductor can be achieved with wire bonding easily carried out, and diffusion of Au into other layers due to heat generated by the current supplied can be prevented, and therefore highly reliable nitride semiconductor laser device with less deterioration in the characteristics can be provided.

The invention claimed is:

1. A nitride semiconductor laser device comprising:
    an n-type nitride semiconductor layer,
    an active layer on said n-type nitride semiconductor layer,
    a p-type nitride semiconductor layer on said active layer, said p-type nitride semiconductor layer having a p-type contact layer as a top layer and a ridge that includes at least said p-type contact layer, the ridge being substantially parallel to a direction of resonance, and
    a p-type ohmic electrode that makes ohmic contact with said p-type contact layer of said ridge,
    wherein a first insulation film having a first a aperture for opening an upper surface of said ridge covers at least a side face of said ridge and a proximate region outside of said side face,
    wherein said p-type ohmic electrode makes contact with said p-type contact layer through said aperture, and a second insulation film is on said first insulation film.

2. The nitride semiconductor laser device according to claim 1,
    wherein said second insulation film is in continuation with a resonating end face so as to form a laser reflection plane on said resonating end face.

3. The nitride semiconductor laser device according to claim 1,
    wherein said first insulation film and said second insulation film are made of oxide compound.

4. The nitride semiconductor laser device according to claim 1,
    wherein said first insulation film is made of $ZrO_2$.

5. The nitride semiconductor laser device according to claim 1,
    wherein said second insulation film is made of $TiO_2$ or $SiO_2$.

6. The nitride semiconductor laser device according to claim 1,
    wherein said second insulation film is a multi-layered film made by forming $TiO_2$ layer and $SiO_2$ layer one on another.

7. The nitride semiconductor laser device according to claim 1,
    wherein said p-type ohmic electrode is an alloy which is formed by laminating a layer of at least one selected from a group consisting of Ni, Co, Fe, Ti and Cu and an Au layer and then annealing the layers.

8. The nitride semiconductor laser device according to claim 1,
    wherein said second insulation film has an aperture on said p-type ohmic electrode and a p-type pad electrode makes contact with said p-type ohmic electrode through said aperture.

9. The nitride semiconductor laser device according to claim 1,
    wherein said p-type pad electrode includes a bonding layer that makes contact with said p-type ohmic electrode, a barrier layer on said bonding layer and an Au layer on said barrier layer.

10. The nitride semiconductor laser device according to claim 9,
    wherein said bonding layer of said p-type pad electrode includes at least one selected from a group consisting of Ni, Cu, Ru, $RuO_2$, Ti W, Zr, Rh and RhO.

11. The nitride semiconductor laser device according to claim 9,
    wherein said barrier layer of said p-type pad electrode includes at least one selected from a group consisting of Ti, Pt, W, Ta, Mo, nitride thereof and RhO.

12. The nitride semiconductor laser device according to claim 9, wherein said n-type nitride semiconductor layer includes a n-type contact layer that is partially exposed and
    an n-type ohmic electrode is on the exposed n-type contact layer and an n-type pad electrode is on said n-type ohmic electrode, said n-type pad electrode being made of the same material as said p-type pad electrode.

13. The nitride semiconductor laser device according to claim 1,
    wherein said p-type ohmic electrode is made of an alloy which is formed by laminating a layer of at least one kind selected from a group consisting of Ni, Co, Fe, Ti and Cu and an Au layer and then annealing the layers,
    wherein said second insulation film has an aperture located over said p-type ohmic electrode and a p-type pad electrode makes contact with said p-type ohmic electrode through said aperture.

14. The nitride semiconductor laser device according to claim 13,
    wherein said p-type pad electrode is constituted from a bonding layer made of Rh or RhO in contact with said p-type ohmic electrode, and an Au layer formed on said bonding layer.

15. The nitride semiconductor laser device according to claim 13,
    wherein said p-type pad electrode is constituted from a bonding layer made of Rh or RhO in contact with said p-type ohmic electrode, a barrier layer on said bonding layer including at least one material selected from a group consisting of Ti, Pt, W, Ta, Mo and nitride thereof, and an Au layer on the barrier layer.

16. The nitride semiconductor laser device according to claim 13,
    wherein said p-type pad electrode comprises a bonding layer made of RhO in contact with said p-type ohmic electrode, wherein a top layer of said p-type ohmic electrode is an RhO layer.

17. The nitride semiconductor laser device according to claim 13,
    wherein said first insulation film is made of $ZrO_2$.

18. A nitride semiconductor device comprising,
    a p-type ohmic nitride electrode and
    a p-type pad electrode on said p-type ohmic electrode,
    wherein ohmic is an electrode made of said p-type alloy by laminating a layer of at least one selected from a group consisting of Ni, Co, Fe, Ti and Cu and an Au layer, and then annealing, wherein said p-type pad electrode comprises a bonding layer made of Rh or RhO in contact with said p-type ohmic electrode, a barrier layer on said bonding layer made of at least one material selected from a group of Ti, Pt, W, Ta, Mo and nitride thereof, and an Au layer on said barrier layer.

19. The nitride semiconductor laser device according to claim 18,
wherein said p-type top layer of said p-type ohmic electrode is an RhO layer is included in and said bonding layer is made of RhO.

20. A method forming a nitride for electrodes of an semiconductor device comprising, forming a p-type ohmic electrode by laminating a first layer made of at least one elected from a group consisting of Ni, Co, Fe, Ti and Cu, an Au layer and an RhO layer successively, annealing said p-type ohmic electrode, a step of forming an RhO layer on said p-type ohmic electrode that has been annealed, and forming the p-type pad electrode on the p-type ohmic electrode including forming a RhO layer and forming a Au layer on said RhO layer.

* * * * *